United States Patent [19]

Mizoguchi et al.

[11] Patent Number: 4,795,656
[45] Date of Patent: Jan. 3, 1989

[54] CLUSTER ION PLATING METHOD FOR PRODUCING ELECTRICALLY CONDUCTIVE CARBON FILM

[75] Inventors: Akira Mizoguchi; Jun Shioya; Yoichi Yamaguchi; Yoshinobu Ueba; Hironaga Matsubara, all of Osaka, Japan

[73] Assignee: Kozo Iizuka, Director-General, Agency of Industrial Science and Technology, Tokyo, Japan

[21] Appl. No.: 183,526

[22] Filed: Apr. 14, 1988

Related U.S. Application Data

[63] Continuation of Ser. No. 25,589, Mar. 13, 1987, abandoned.

[30] Foreign Application Priority Data

Aug. 26, 1986 [JP] Japan ............................ 61-198052
Jan. 27, 1987 [JP] Japan ............................ 62-15296

[51] Int. Cl.$^4$ .......................... B05D 3/06; C23C 14/00
[52] U.S. Cl. ................................ 427/38; 204/192.31
[58] Field of Search ..................... 427/38, 249; 204/192.31; 428/408; 423/445, 446

[56] References Cited

U.S. PATENT DOCUMENTS 4,217,855  8/1980  Takagi ......................... 204/192.31
4,571,348  2/1986  Troxell ................................ 427/38

FOREIGN PATENT DOCUMENTS 0138678  11/1979  German Democratic Rep. ... 427/38
0103099   6/1985  Japan ................................. 423/446
0127293   7/1985  Japan ................................. 423/446
1170570   8/1986  Japan ................................. 427/34
2114963   9/1983  United Kingdom ................ 427/38

Primary Examiner—Norman Morgenstern
Assistant Examiner—Margaret Burke
Attorney, Agent, or Firm—Cushman, Darby & Cushman

[57] ABSTRACT

A carbon film having a large electrical conductivity is produced at a comparatively low substrate temperature by a method comprising forming the carbon film from a hydrocarbon by an ion beam method and heating the substrate at a temperature of 400° C. to 1,200° C.

9 Claims, 2 Drawing Sheets

CLUSTER ION PLATING METHOD FOR PRODUCING ELECTRICALLY CONDUCTIVE CARBON FILM

This is a continuation of application Ser. No. 025,589, filed Mar. 13, 1987, which was abandoned on the filing hereof.

BACKGROUND OF THE INVENTION

1. Field of the Invention

The present invention relates to a method for producing an electrically conductive carbon film. More particularly, it relates to a method for producing an electrically conductive carbon film on a substrate by an ion beam method at a comparatively low substrate temperature.

2. Description of the Prior Art

Conventionally, an electrically conductive carbon film is produced by a pyrolysis (or thermal decomposition) method (cf. J. C. Bokros, "Chemistry and Physics of Carbon", Vol. 5, 1–118 (1969), Marcel Dekker Inc.). This method comprises heating a reaction system in an atmosphere comprising an aliphatic or aromatic hydrocarbon such as methane, ethane, propane and benzene at a temperature of 1,200° to 2,200° C. to decompose the hydrocarbon and depositing carbon on a surface of a substrate to form a carbon film.

The carbon film produced by the pyrolysis method has conductivity of about 0.2 S/cm, 70 S/cm, $2 \times 10^2$ S/cm and $5 \times 10^2$ S/cm when the substrate is heated at 600° C., 1,000° C., 1,200° C. and 2,200° C., respectively. Therefore, according to this method, it is necessary to heat the substrate at a comparatively high temperature to produce a carbon film having sufficiently large conductivity, so that kinds of the substrate are restricted to those having good heat resistance and thermal stability.

Recently, a plasma CVD (chemical vapor deposition) method has attracted more and more attention for producing an electrically conductive carbon film (cf. Y. Onuma, Y. Kato, M. Nakao and H. Matsushima, Japanese J. of Appl. Phys., 22(5), 888 (1983) and J. Shioya, H. Matsubara and S. Murakami, Synthetic Metals, 14, 113 (1986)).

The plasma CVD method comprises discharging high frequency waves in an atmosphere of the hydrocarbon as used in the pyrolysis method to plasma-polymerize it and deposit carbon on the substrate. Although the produced carbon film has a conductivity of as high as 1,000 S/cm when the substrate is heated at 1,000° C., it has conductivity of 50 S/cm and 0.3 S/cm when the substrate is heated at 800° C. and 600° C. Such low conductivity is on the same order as achieved by the pyrolysis method.

SUMMARY OF THE INVENTION

One object of the present invention is to provide a method for producing a carbon film having a large conductivity on a substrate which exhibits deformation or a change of characteristics at a high temperature.

Another object of the present invention is to provide a method for producing a carbon film at a low substrate temperature not higher than 1,200° C.

These and other objects of the present invention are achieved by a method for producing an electrically conductive carbon film on a substrate comprising forming the carbon film from a hydrocarbon by an ion beam method and heating the substrate at a temperature of 400° C. to 1,200° C.

DETAILED DESCRIPTION OF THE INVENTION

According to the present invention, the carbon film is produced from any solid, liquid or gaseous material which contains at least a carbon atom and can be gasified by heating. Particularly, the raw material has a small hydrogen/carbon (H/C) ratio, preferably a H/C ratio of smaller than 2 since the raw material having the small H/C ratio is easily handled and carbonized than that having a large H/C ratio. Preferred examples of the raw material are saturated aliphatic hydrocarbons (e.g. methane, ethane, propane, etc.), unsaturated aliphatic hydrocarbon (e.g. ethylene, propylene, acetylene, etc.) and aromatic hydrocarbons (e.g. benzene, naphthalene, anthracene, pyrene, etc.) as well as mixtures of at least two of them.

Since the carbon is deposited on the substrate at a comparatively low temperature, the substrate can be selected from a wider range than in the conventional pyrolysis method or the plasma CVD method. Specific examples are a metal (e.g. iron, nickel and aluminum), an intermetallic compound (e.g. GaAs and InP), a metal oxide (e.g. $SiO_2$, $Al_2O_3$ and $TiO_2$), a carbonaceous material (e.g. graphite, diamond, diamond-like carbon and carbon fiber), a crystalline alkali halide (e.g. sodium chloride and potassium bromide). The substrate may be of any shape such as fiber, fabric, film, sheet, tape, block or plate.

Figure 1:
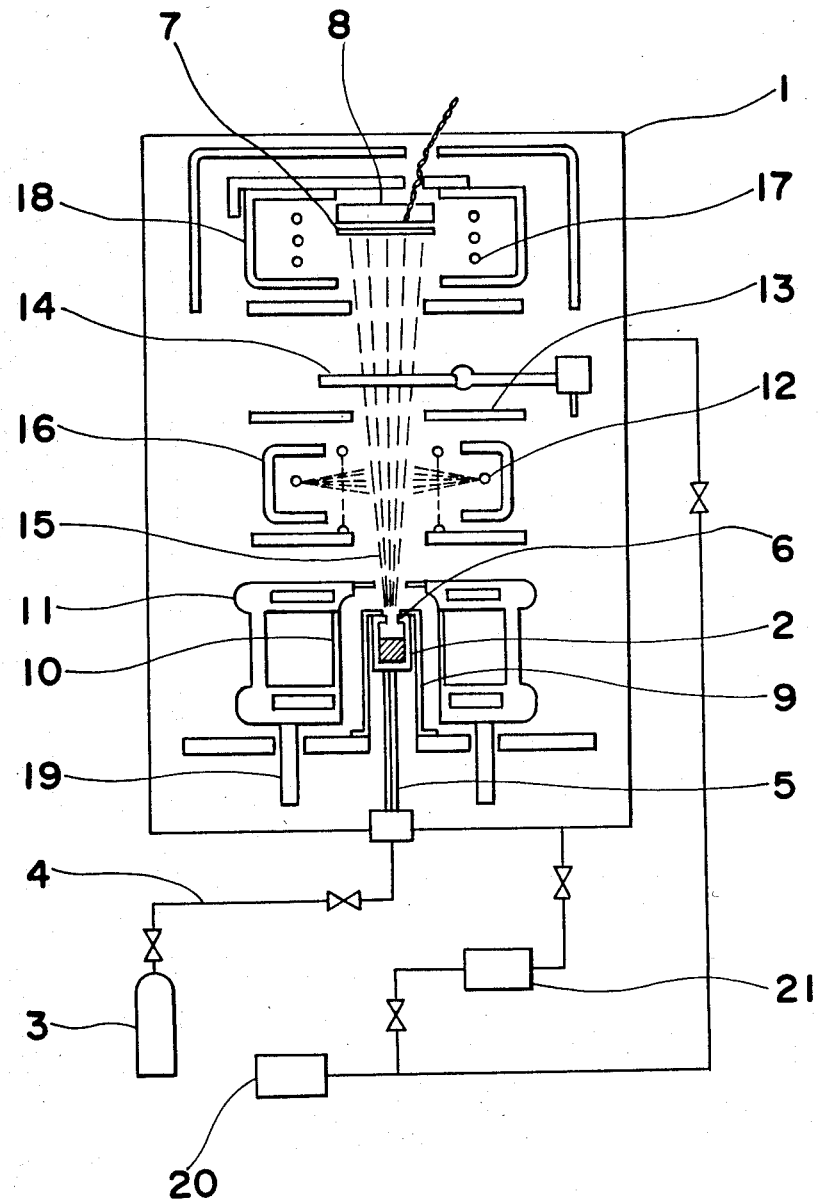
FIG. 1 schematically shows an apparatus for carrying out the ion beam method.

For carrying out the ion beam method, for example, an apparatus as shown in FIG. 1 can be employed. Such apparatus is described by H. Usui, I. Yamada and T. Takagi, J. of Vacuum Sci. and Tech., A4(1), 52 (1986), the disclosure of which is hereby incorporated by reference.

In FIG. 1, the apparatus comprises a chamber 1 in which a crucible 2 is placed. To the crucible, a raw material hydrocarbon is supplied from a raw material source 3 through a raw material supplying system 4 and a raw material supplying tube 5. In the upper wall of the crucible 2, a nozzle 6 is installed for jetting the raw material. In the upper part of the chamber 1, a substrate 7 is placed on a substrate holder 8.

In this apparatus, the crucible 2 is surrounded by a heater 9, which may be a graphite heater. Around the heater 9, a thermal insulator 10 and a cooling jacket 11 are provided.

Between the nozzle 6 and the substrate 7, there are provided electron discharging filaments 12 for ionizing the raw material, an ion accelerating electrode 13 for accelerating the ions of the raw material towards the substrate and a shutter 14. The electron discharging filaments 12 are so arranged that electrons are discharged towards the raw material beam 15 from three directions. Between the electron discharging electrode 12 and the raw material beam 15, electron accelerating electrodes (grids) 16 are provided.

Around the substrate 7, a heater 17 for heating the substrate 7 and a heat barrier 18 for preventing radiation of heat from the heater are provided.

Further, the apparatus has an inlet 19 for a coolant such as water, an oil-sealed rotary pump 20 and an oil diffusion pump 21 to control the temperature and pressure in the chamber.

According to the present invention, the electrically conductive carbon film is produced on the substrate by means of the above described apparatus as follows:

The substrate is set on the substrate holder 8 in the chamber 1 and the interior pressure of the chamber is reduced to $1-2 \times 10^{-6}$ mmHg by a pressure reducing system comprising the oil-sealed rotary pump 20 and the oil diffusion pump 21. Then, the raw material is jetted from the nozzle 6 of the crucible 2. When the raw material is a volatile one such as benzene, it is not necessary to heat the crucible 2. However, when the raw material is in the solid state at room temperature such as pyrene, the crucible is heated at a temperature of 100° to 1,000° C. When the raw material vapor is in the form of cluster or agglomerate, a better carbon film can be produced. For this end, the pressure in the chamber 1 is preferably kept at about one hundredth of that in the crucible 2.

When a voltage of several ten volts to several hundred volts is applied between the electron discharging filaments 12 and the electron accelerating electrode 16, electrons are discharged towards the raw material beam 15 to ionize the raw material.

The ionized raw material is accelerated by the ion accelerating electrode 13 and deposited on the substrate which is heated at a temperature of 400° to 1,200° C., preferably 400° to 1,000° C., more preferably 400° to 800° C. The accelerating voltage is preferably from 1 to 3 kV.

The present invention will be illustrated by following examples.

EXAMPLE 1

As a substrate, an undoped silicon wafer having a thickness of about 400 μm was installed in the substrate holder 8 in the chamber of the apparatus shown in FIG. 1 and heated to 1,000° C. with rotation.

Then, as a raw material, benzene was jetted from the nozzle 6 of the crucible 2, ionized and deposited under following conditions to form a light-gray carbon film on the substrate:

| | |
|---|---|
| Pressure of benzene in the chamber: (base pressure of $2 \times 10^{-6}$ mmHg) | $5.0 \times 10^{-5}$ mmHg |
| Current through the ion discharging filament: | 30 A |
| Electron accelerating voltage: | 500 V |
| Ion accelerating voltage: | 3 kV |
| Distance between nozzle and substrate: | 56 cm |
| Deposition time | 24 hrs |

The produced carbon film had a thickness of about 0.16 μm and conductivity of about 1,000 S/cm at room temperature.

According to the Raman spectroscopy, the produced carbon film had substantially the same degree of graphitization as that of carbon produced by pyrolysis of benzene at a temperature of 1,500° to 1,600° C.

EXAMPLE 2

In the same manner as in Example 1 but changing the distance between the nozzle and the substrate to 15 cm and carrying out ion beam deposition for 4 hours, carbon was deposited on the substrate to form a dark brown carbon film having a thickness of about 1.2 μm and conductivity of 110 S/cm at room temperature.

EXAMPLE 3

In the same manner as in Example 2 but using an optically polished quartz glass substrate having a thickness of about 1 mm in place of the silicon wafer, carbon was deposited on the substrate to form a dark brown carbon film having a thickness of about 1.1 μm and conductivity of 170 S/cm at room temperature.

COMPARATIVE EXAMPLE 1

In the same manner as in Example 1 but not heating the silicon wafer, no carbon was deposited on the substrate.

COMPARATIVE EXAMPLE 2

In the same manner as in Example 2 but not heating the silicon wafer, carbon was deposited on the substrate to form a carbon film having a thickness of 1.5 μm and conductivity of $7.7 \times 10^{-3}$ S/cm at room temperature.

EXAMPLE 4

As a substrate, an optically polished quartz substrate having thickness of 1 mm was installed in the substrate holder 8 in the chamber of the apparatus shown in FIG. 1 and heated to 1,000° C. with rotation.

Then, as a raw material, benzene was jetted from the nozzle 6 of the crucible 2, ionized and deposited under following conditions to form a dark brown carbon film on the substrate:

| | |
|---|---|
| Pressure of benzene in the chamber: (base pressure of $2 \times 10^{-6}$ mmHg) | $5.0 \times 10^{-5}$ mmHg |
| Current through the ion discharging filament: | 30 A |
| Electron accelerating voltage: | 500 V |
| Ion accelerating voltage: | 2 kV |
| Distance between nozzle and substrate: | 15 cm |
| Deposition time | 2 hrs |

The produced carbon film was homogeneous and firmly adhered to the substrate and had a thickness of about 0.14 μm and conductivity of 150 S/cm at room temperature.

EXAMPLE 5

In the same manner as in Example 4 but heating the substrate at 900° C., carbon was deposited on the substrate to form a dark brown carbon film having a thickness of about 0.28 μm and conductivity of 180 S/cm at room temperature.

EXAMPLE 6

In the same manner as in Example 4 but heating the substrate at 800° C., carbon was deposited on the substrate to form a dark brown carbon film having a thickness of about 0.50 μm and conductivity of 120 S/cm at room temperature.

EXAMPLE 7

In the same manner as in Example 4 but heating the substrate at 600° C., carbon was deposited on the substrate to form a dark brown carbon film having a thickness of about 0.60 μm and conductivity of 70 S/cm at room temperature.

EXAMPLE 8

In the same manner as in Example 4 but heating the substrate at 400° C., carbon was deposited on the substrate to form a dark brown carbon film having a thickness of about 0.34 μm and conductivity of 95 S/cm at room temperature.

COMPARATIVE EXAMPLE 3

Benzene was pyrolized under following conditions and deposited on the quartz substrate heated at 1,000° C. to form a yellowish brown carbon film:

| | |
|---|---|
| Pressure of benzene in the chamber: (base pressure of 2 × 10⁻⁶ mmHg) | 5.0 × 10⁻⁵ mmHg |
| Distance between nozzle and substrate: | 15 cm |
| Deposition time | 2 hrs |

The produced carbon film had a thickness of about 0.06 μm and conductivity of 50 S/cm at room temperature.

COMPARATIVE EXAMPLE 4

In the same manner as in Comparative Example 3 but heating the substrate at 900° C., benzene was pyrolized and deposited on the substrate to form a yellowish brown carbon film having a thickness of 0.06 μm and conductivity of 15 S/cm at room temperature.

COMPARATIVE EXAMPLE 5

In the same manner as in Comparative Example 3 but heating the substrate at 800° C., benzene was pyrolized and deposited on the substrate to form a yellowish brown carbon film having a thickness of 0.08 μm and conductivity of 4.2 S/cm at room temperature.

COMPARATIVE EXAMPLE 6

In the same manner as in Comparative Example 3 but heating the substrate at 600° C., benzene was pyrolized and deposited on the substrate to form a yellowish brown carbon film having a thickness of 0.09 μm and conductivity of 0.12 S/cm at room temperature.

COMPARATIVE EXAMPLE 7

In the same manner as in Comparative Example 3 but heating the substrate at 500° C., benzene was pyrolized and deposited on the substrate to form a yellowish brown carbon film having a thickness of 0.12 μm and conductivity of 1.0×10⁻³ S/cm at room temperature.

COMPARATIVE EXAMPLE 8

Benzene was subjected to the plasma CVD under following conditions and deposited on the quartz substrate heated at 1,000° C. to form a carbon film with metallic gloss:

| | |
|---|---|
| Pressure of benzene: | 1 mmHg |
| Plasma output power: | 40 W (13.56 MHz) |
| Deposition time: | 2 hrs |

The produced carbon film had a thickness of about 5.0 μm and conductivity of 1,000 S/cm at room temperature.

COMPARATIVE EXAMPLE 9

In the same manner as in Comparative Example 6 but heating the substrate at 900° C., benzene was subjected to the plasma CVD and deposited on the substrate to form a carbon film with metallic gloss having a thickness of 6.0 μm and conductivity of 500 S/cm at room temperature.

COMPARATIVE EXAMPLE 10

In the same manner as in Comparative Example 6 but heating the substrate at 800° C., benzene was subjected to the plasma CVD and deposited on the substrate to form a carbon film with metallic gloss having a thickness of 12.0 μm and conductivity of 53 S/cm at room temperature.

COMPARATIVE EXAMPLE 11

In the same manner as in Comparative Example 6 but heating the substrate at 600° C., bezzene was subjected to the plasma CVD and deposited on the substrate to form a carbon film with metallic gloss having a thickness of 16.0 μm and conductivity of 0.3 S/cm at room temperature.

EXAMPLE 9

In the same manner as in Example 4 but changing the ion accelerating voltage to 1 kV, carbon was deposited on the substrate to form a dark brown carbon film having a thickness of about 0.12 μm and conductivity of 76 S/cm at room temperature.

EXAMPLE 10

In the same manner as in Example 4 but changing the ion accelerating voltage to 3 kV, carbon was deposited on the substrate to form a dark brown carbon film having a thickness of about 0.50 μm and conductivity of 133 S/cm at room temperature.

COMPARATIVE EXAMPLE 11

In the same manner as in Example 4 but changing the ion accelerating voltage to 4 kV, no carbon was deposited on the substrate by sputtering.

COMPARATIVE EXAMPLE 12

In the same manner as in Example 4 but changing the ion accelerating voltage to 5 kV, no carbon was deposited on the substrate by sputtering.

Figure 2:
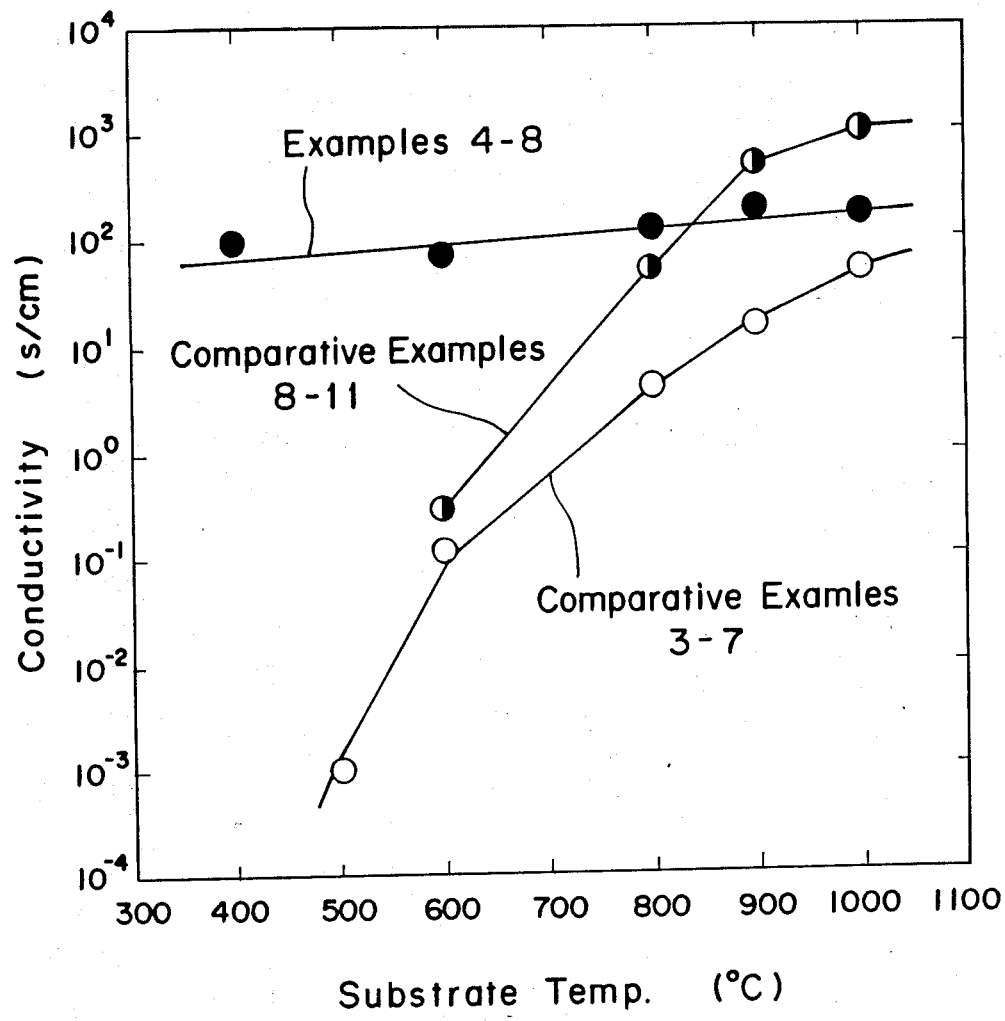
FIG. 2 is a graph showing the relationship between the substrate temperature and the conductivity of the produced carbon film produced in Examples 4–8 and Comparative Examples 3–11.

The results of Examples 4–8 and Comparative Examples 3–11 are plotted in the graph of FIG. 2.

What is claimed is:

1. A method for producing an electrically conductive carbon film on a substrate comprising
   (a) ionizing a solid or liquid hydrocarbon to form a cluster ion beam which is being jetted towards a substrate by discharged electrons,
   (b) accelerating generated hydrocarbon ions in an electric field, and
   (c) depositing the hydrocarbon ions on a substrate which is heated at a temperture of 400 ° C. to 1,200 ° C.

2. The method according to claim 1, wherein the substrate is heated at a temperature of 400° to 1,000° C.

3. The method according to claim 2, wherein the substrate is heated at a temperature of 400 ° to 800° C.

4. The method according to claim 1, wherein a voltage of the electric field for accelerating the hydrocarbon ions is in the range from 1 to 3 kV.

5. The method according to claim 1, wherein the hydrocarbon is one having a hydrogen/carbon ratio of lower than 2.

6. The method according to claim 5, wherein the hydrocarbon is an aromatic hydrocarbon.

7. The method according to claim 6, wherein the aromatic hydrocarbon is benzene.

8. The method according to claim 1, wherein the substrate is a silicon wafer.

9. The method according to claim 1, wherein the substrate is a quartz substrate.

* * * * *